US012786544B2

(12) United States Patent
Chusseau

(10) Patent No.: US 12,786,544 B2
(45) Date of Patent: Nov. 3, 2026

(54) VERTICALLY MOUNTED ADD-ON CAMERA MODULE

(71) Applicant: SAGEMCOM BROADBAND SAS, Bois-Colombes (FR)

(72) Inventor: Hugo Chusseau, Bois-Colombes (FR)

(73) Assignee: SAGEMCOM BROADBAND SAS, Bois-Colombes (FR)

( * ) Notice: Subject to any disclaimer, the term of this patent is extended or adjusted under 35 U.S.C. 154(b) by 103 days.

(21) Appl. No.: 18/740,052

(22) Filed: Jun. 11, 2024

(65) Prior Publication Data

US 2024/0422418 A1 Dec. 19, 2024

(30) Foreign Application Priority Data

Jun. 13, 2023 (FR) ....................................... 2305998

(51) Int. Cl.

*H04N 23/57* (2023.01)
*H04N 23/51* (2023.01)
*H05K 1/181* (2026.01)

(52) U.S. Cl.

CPC ............. *H04N 23/57* (2023.01); *H04N 23/51* (2023.01); *H05K 1/181* (2013.01); *H05K 2201/10083* (2013.01); *H05K 2201/10121* (2013.01); *H05K 2201/10151* (2013.01)

(58) Field of Classification Search

CPC ........ H04N 23/57; H04N 23/51; H04N 21/41; H04N 5/64; H05K 1/181; H05K 2201/10083; H05K 2201/10121; H05K 2201/10151

See application file for complete search history.

(56) References Cited

U.S. PATENT DOCUMENTS

2007/0110430 A1* 5/2007 Shi ......................... G03B 17/02 396/428
2019/0132954 A1* 5/2019 Kim ......................... G02B 7/02
2022/0182516 A1* 6/2022 Lee ........................ H04N 23/54

FOREIGN PATENT DOCUMENTS

EP 0873010 A1 * 10/1998 ............. H04N 23/51

* cited by examiner

*Primary Examiner* — Twyler L Haskins
*Assistant Examiner* — John H Morehead, III
(74) *Attorney, Agent, or Firm* — Muncy, Geissler, Olds & Lowe, P.C.

(57) ABSTRACT

An electrical module, intended to be incorporated into an item of electrical equipment, includes a support, a hole and lateral edges arranged to implement a sliding connection for inserting the support vertically into a notch formed in an edge of a lateral face of the housing of the equipment, at least one dust protection component, and a printed circuit board comprising a camera. The electrical module is such that the printed circuit board is fastened to the support in such a way that the camera is facing the hole, and the at least one protection component forms, with a thickness of the support, an enclosure in which a lens of the camera is positioned.

9 Claims, 6 Drawing Sheets

VERTICALLY MOUNTED ADD-ON CAMERA MODULE

The invention relates to the field of electrical equipment incorporating a camera.

BACKGROUND OF THE INVENTION

Electrical equipment comprising a housing and a camera incorporated in the housing is known.

For example, some set-top box (STB) manufacturers now consider incorporating a camera into their equipment.

The camera may be incorporated directly into one of the faces of the equipment housing, generally the front face. This design meets both functional and cosmetic requirements.

This design has the following disadvantage for the manufacturer of the electrical equipment, who carries out the final assembly. The manufacturer must have complete control over the cleanliness of the assembly line on which the electrical equipment is being assembled, in order to prevent the camera lens being contaminated by dust deposits.

Camera suppliers recommend ISO class 8 for assembly stations. The maximum permissible particle concentrations are as follows in an ISO 8 clean room:

- 3,520,000 particles per cubic metre with a size greater than or equal to 0.5 μm;
- 832,000 particles per cubic metre with a size greater than or equal to 1 μm;
- 29,300 particles per cubic metre with a size greater than or equal to 5 μm.

Controlled-environment assembly stations, which ensure that these concentrations are not exceeded, are expensive and take up a lot of space. However, when incorporating a camera is not part of the traditional core business of an electrical equipment manufacturer, as is the case for a manufacturer of set-top boxes, the manufacturer's assembly lines are not equipped with such assembly stations. Dealing with this contamination problem therefore makes assembly lines more complex and significantly more expensive.

Some electrical equipment manufacturers are also faced with another constraint.

Generally, the electrical equipment on the market incorporating a camera on the front face is assembled in an assembly direction parallel to the axis of the camera, i.e., in a front-rear direction.

However, some electrical equipment is designed for an up-down assembly direction, which is therefore orthogonal to the axis of the camera. The assembly line therefore also needs to incorporate this constraint of multiple assembly directions, further increasing its complexity.

OBJECT OF THE INVENTION

The object of the invention is to simplify and reduce the cost of assembling electrical equipment incorporating a camera in a vertical direction, while solving the problem of dust contamination.

SUMMARY OF THE INVENTION

In order to achieve this aim, an electrical module intended to be incorporated into an item of electrical equipment is proposed, comprising:

- a support that comprises an inner wall, a hole passing through the thickness of the support, and lateral edges arranged to implement a sliding connection for inserting the support vertically into a notch formed in a lower or upper edge of a lateral face of a housing part of the electrical equipment;
- at least one dust protection component; and
- a printed circuit board comprising a camera;

the electrical module being such that, when it is assembled, the printed circuit board is fastened to the inner wall of the support in such a way that the camera is positioned facing the hole, and the at least one dust protection component forms, with a thickness of the support, an enclosure in which a lens of the camera is positioned and which protects it from dust.

When the electrical module has been assembled, preferably in a controlled environment, the lens of the camera is protected from dust. The add-on electrical module can then be incorporated in a second stage into the electrical equipment in a conventional manner, without the need for a controlled-environment assembly station.

The electrical equipment manufacturer can therefore have the electrical module assembled by another entity, receive the electrical module, and then assemble the electrical equipment on a "traditional" assembly line. This significantly reduces the cost and complexity of assembly for the electrical equipment manufacturer, who does not need to modify the assembly line due to the presence of the camera.

The add-on electrical module can also be incorporated vertically, easily and quickly, into the lateral face of the housing part of the electrical equipment, by virtue of the sliding connection.

Also proposed is an electrical module as previously described, in which the at least one dust protection component comprises a seal positioned around the camera lens between the printed circuit board and the support, and a protective window fastened to an outer wall of the support.

Also proposed is an electrical module as previously described, in which the support comprises at least one first fastening post situated next to a first lateral edge of the support, and at least one second fastening post situated next to a second lateral edge of the support, the first fastening post and the second fastening post allowing the printed circuit board to be fastened to the inner wall of the support, a longitudinal axis of each fastening post being tilted upwards, relative to a horizontal plane, by a non-zero angle.

Also proposed is an electrical module as previously described, the support further comprising a first fastening bracket and a second fastening bracket that extend in the horizontal plane and that make it possible to fasten the electrical module to the housing part, the first fastening bracket and the second fastening bracket extending laterally and towards the outside of the support respectively from the first fastening post and the second fastening post, such that, when the electrical module is assembled, the printed circuit board is positioned between the first fastening bracket and the second fastening bracket.

Also proposed is an electrical module as previously described, in which the support comprises two first fastening posts and two second fastening posts, and in which a first microphone and a second microphone are mounted on the printed circuit board, the first microphone and the second microphone being in acoustic communication with the outside respectively via a first duct and a second duct formed on the support, the first duct extending between the two first fastening posts and the second duct between the two second fastening posts.

Also proposed is an electrical module as previously described, in which an infrared receiver is mounted on the printed circuit board, the support being manufactured from a material that is transparent or translucent to infrared light.

Also proposed is an item of electrical equipment comprising:

an electrical module as previously described; and a housing comprising a housing part having a lateral face comprising a lower or upper edge in which a notch is formed, lateral edges of the notch being arranged to cooperate with the lateral edges of the support in order to implement the sliding connection;

an outer wall of the support of the electrical module extending into the notch in order to form a portion of an outer wall of the lateral face of the housing part.

Also proposed is an item of electrical equipment as previously described, in which the housing part comprises a reinforcing rib that extends vertically from a bottom of the housing part, linking the lateral edges of the notch to each other.

Also proposed is an item of electrical equipment as previously described, the electrical equipment being a set-top box.

The invention shall be better understood in the light of the following description of a specific and non-limiting embodiment of the invention.

BRIEF DESCRIPTION OF THE DRAWINGS

Reference will be made to the accompanying drawings, in which.

DETAILED DESCRIPTION OF THE INVENTION

Figure 1:
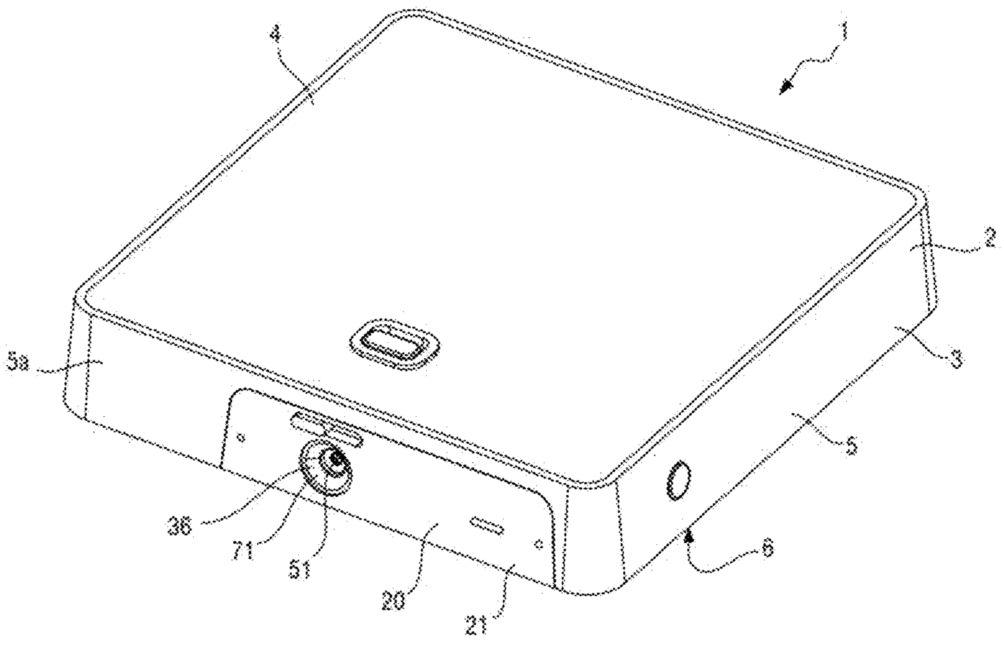
FIG. 1 is a perspective view, from above and from the front, of the set-top box when in a nominal operating position.

In reference to FIG. 1, the set-top box 1 comprises a housing 2.

The housing 2 comprises a housing part 3, which comprises an upper face 4 and lateral faces 5. The lateral faces 5 comprise a front face 5*a*.

The upper face 4 and the lateral faces 5 of the housing part 3 are also those of the housing 2.

The housing 2 also comprises a lower chassis 6, which forms its lower face.

A loudspeaker (not shown here), facing upwards, is incorporated into the set-top box 1. Its diaphragm opens out at the upper face 4 of the housing part 3 (which is also the upper face of the housing 2). The sounds emitted by the loudspeaker exit the housing 2 in an upward direction through one or more holes formed in the upper face 4 (not shown here).

When the set-top box 1 is in its nominal operating position, it is installed in such a way that the lower face 6 of the housing 2 rests on a support (for example, the unit on which the television set to which the set-top box is connected is also positioned), and in such a way that the front face 5*a* of the housing 1 faces the position of the user.

In this case, all positional terms, such as front, rear, upper, lower, left, right, horizontal, vertical, etc., should be interpreted with the set-top box 1 considered to be located in its nominal operating position, and seen from the front (as seen by the user).

Figure 2:
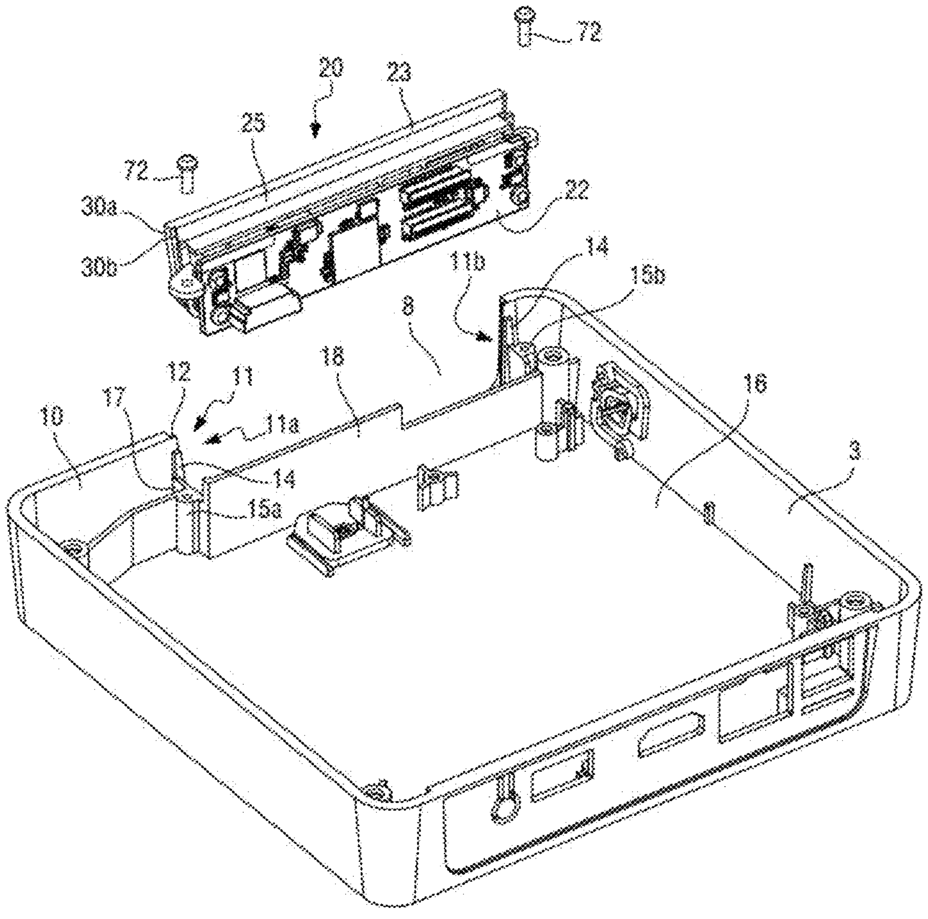
FIG. 2 is a perspective view, from below and from the rear, of the set-top box without the lower chassis of the housing.
Figure 3:
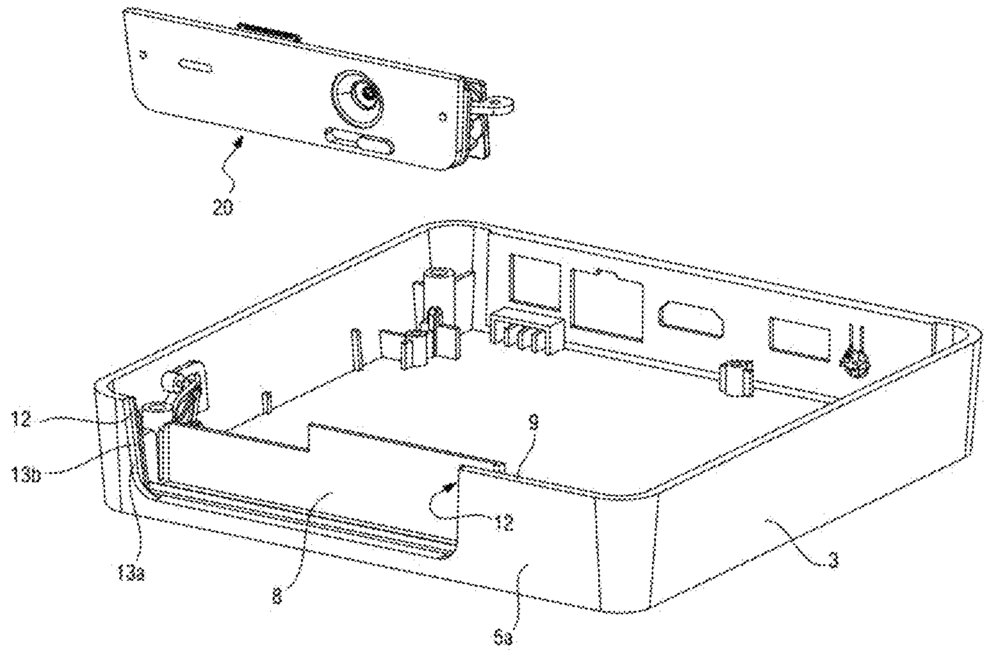
FIG. 3 is a view similar to that of FIG. 2, but from the front of the set-top box.
Figure 4:
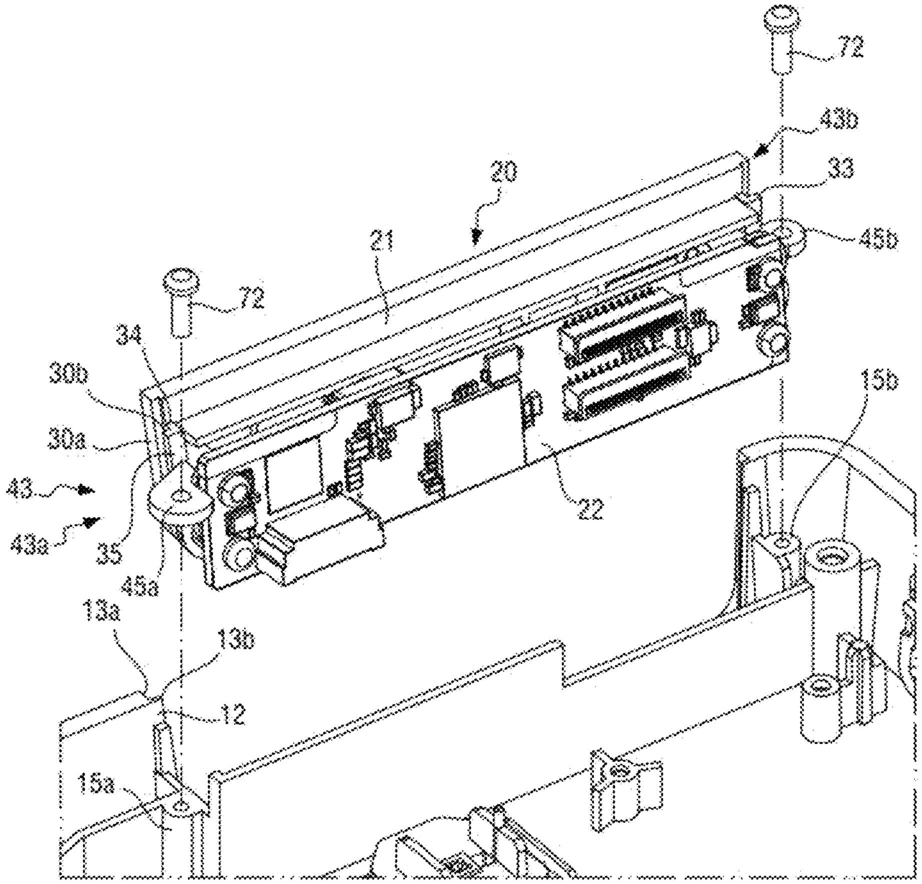
FIG. 4 is a detail view of FIG. 2.
Figure 5:
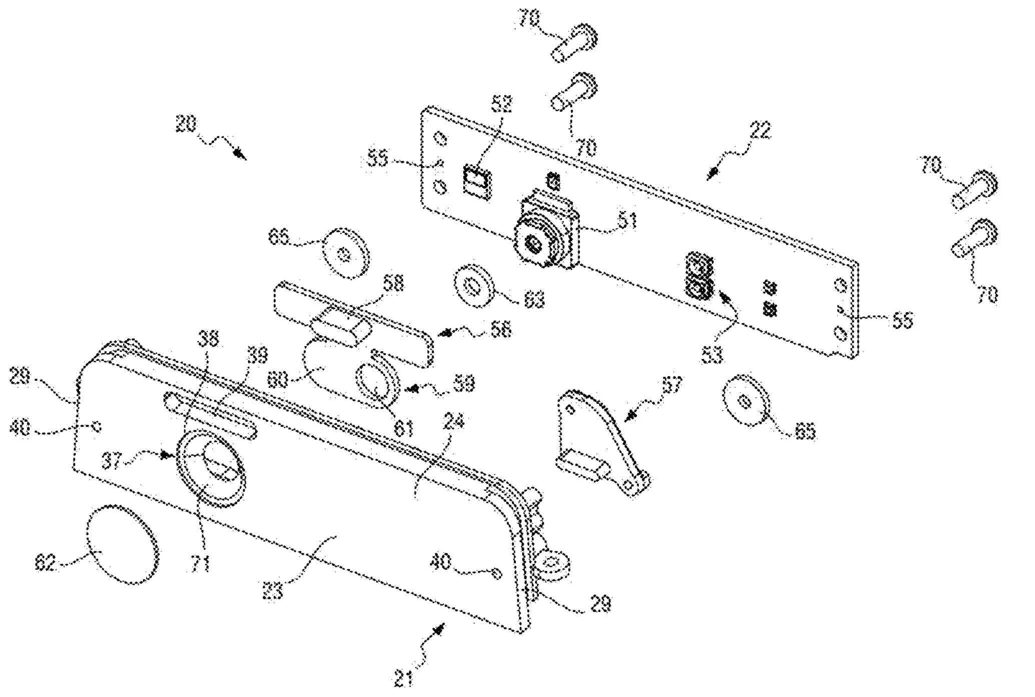
FIG. 5 is a perspective exploded view, from the front, of the electrical module.
Figure 6:
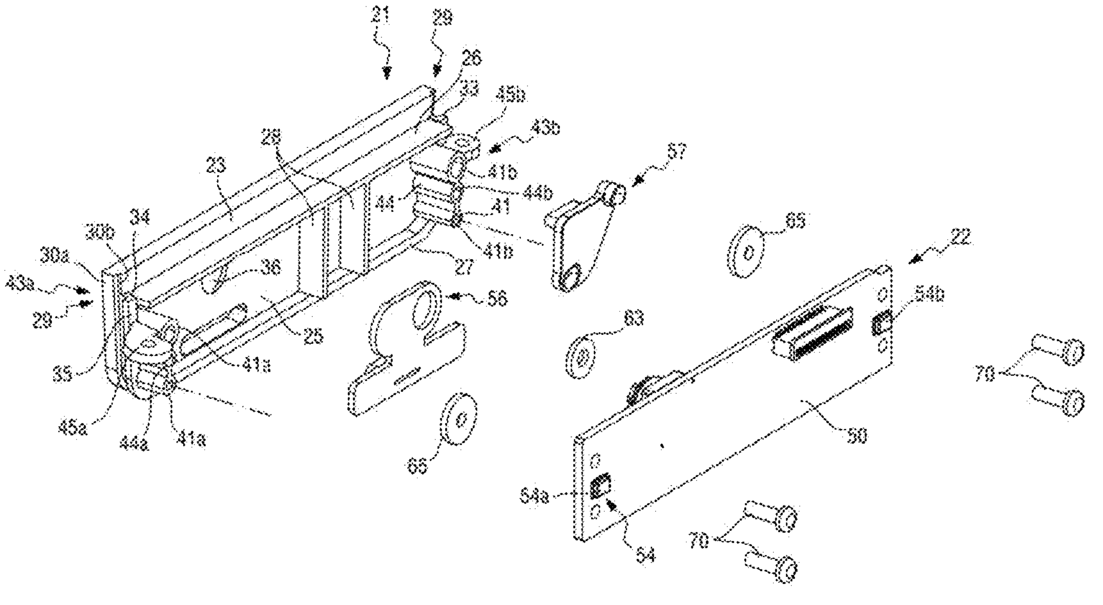
FIG. 6 is a view similar to that of FIG. 5, but from the rear of the electrical module.
Figure 7:
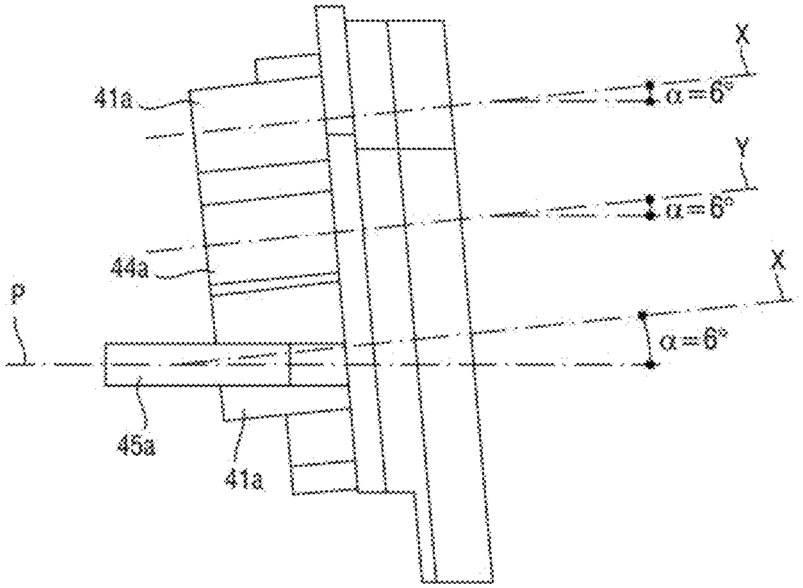
FIG. 7 is a partial side view of the support of the electrical module.
Figure 8:
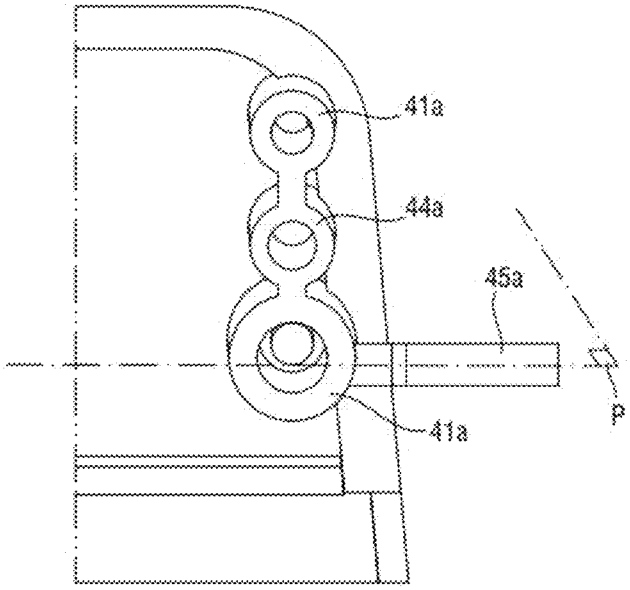
FIG. 8 is a view similar to that of FIG. 7, but from the rear of the support.

In reference to FIGS. 2 and 3, a notch 8 (cutout) is formed in the lower edge 9 of the front face 5*a* of the housing part 3. The notch 8 is situated on the right of the front face 5*a*.

The notch 8 is trapezoidal in shape, and the corners of its upper edge are rounded (corners of the small base of the trapezoid). The length of the lower edge of the notch 8 is greater than its height.

The inner (lateral) wall 10 of the housing part 3 extends slightly at the lateral edges 11*a*, 11*b* of the notch 8, thus defining, for each lateral edge 11, a portion 12 that extends over the entire height of said lateral edge 11, alongside said lateral edge 11, and that protrudes towards the centre of the notch 8. The rim of each lateral edge 11 therefore comprises a first surface 13*a* (outer side) and a second surface 13*b* (inner side) defined in the thickness of the housing part 3.

The housing part 3 also comprises two longitudinal portions 14 forming lateral reinforcements. Each lateral reinforcement 14 extends from the inner wall 10 of the housing part 3, alongside a lateral edge 11 at the surface of the inner wall 10 belonging to the portion 12.

The housing part 3 also comprises a first fastening post 15*a* situated in the vicinity of the first lateral edge 11*a* of the notch 8, and a second fastening post 15*b* situated in the vicinity of the second lateral edge 11*b* of the notch 8.

The fastening posts 15 extend vertically from a bottom 16 of the housing part 3. The bottom 16 is the inner wall of the upper face 4. Each fastening post 15 is linked by a vertical rib 17 to one of the lateral reinforcements 14.

The housing part 3 also comprises a reinforcing rib 18 that extends vertically from the bottom 16 of the housing part 3 and inside the housing part 3, linking the lateral edges 11 of the notch 8 to each other. The reinforcing rib 18 is set back into the housing part 3 in relation to the notch 8.

The reinforcing rib 18 helps to compensate for the weakness created in the housing part 3 by the notch 8, and therefore to prevent the housing part 3 from undergoing deformation both during the injection process at the time of manufacture, under the effect of the internal stresses in the thermoplastic material that are released as the part cools, and during the operation of the set-top box 1, under the effect of the vibrations generated by the loudspeaker.

The set-top box 1 also comprises a motherboard, and an antenna positioned parallel to and in the vicinity of the front face 5*a* (not shown here).

In reference to FIGS. 4 to 8, the set-top box 1 also comprises an electrical module 20. The electrical module comprises a support 21 and a printed circuit board 22.

The support 21 comprises a plate 23 that is trapezoidal in shape.

The plate 23 comprises an outer wall 24 and an inner wall 25, which are also the outer wall and the inner wall of the support 21.

The outer wall 24 is the same shape as the notch 8.

Ribs extend vertically from the inner wall 25. The ribs comprise a rib 26 that extends parallel to and in the vicinity of the lower edge, a rib 27 that runs along the upper edge and its rounded corners, and two ribs 28 that link the ribs 26, 27, being perpendicular to them.

The inner rib of each lateral edge 29 of the plate 23 is recessed in such a way that the rim of each lateral edge 29 has a first surface 30*a* (outer side) and a second surface 30*b* (inner side) defined in the thickness of the plate 23, the second surface 30*b* being indented relative to the first surface 30*a*.

The plate 23 also comprises two angle-shaped portions 33, which extend from its inner wall 25. Each portion 33 extends longitudinally in the vicinity of a lateral edge 29 of the plate and comprises a flange 34 that has a surface extending in the continuity of the second surface 30*b*, and a flange 35 perpendicular to said second surface 30*b*.

The plate 23 also comprises a circular hole 36 that passes through the thickness of the plate 23 and therefore the support 21. A shoulder 37 is formed in the thickness of the plate 23 around the hole 36. This shoulder 37 defines a surface 38 that extends around the circumference of the hole 36 and that is indented relative to the outer wall 24 of the plate 23.

The plate 23 also comprises an oblong hole 39 situated above the hole 36. The length of the hole 39 is parallel to the upper and lower edges of the plate.

The plate 23 also comprises two circular holes 40 each situated in the vicinity of a different lateral edge 29 of the plate 23.

The support 21 comprises at least one first fastening post 41*a* situated next to a first lateral edge 43*a* of the support, and at least one second fastening post 41*b* situated next to a second lateral edge 43*b* of the support.

In this instance, the support 21 comprises two first fastening posts 41*a* and two second fastening posts 41*b*, which each extend from the inner wall 25 of the plate 23. The fastening posts 41 are, in this instance, smooth posts, the screws used being self-tapping screws (although the holes could be tapped).

The first fastening posts 41*a* and the second fastening posts 41*b* allow the printed circuit board 22 to be fastened to the inner wall 25 of the support 21.

The longitudinal axis X of each fastening post 41 is tilted upwards, relative to a horizontal plane P, by a non-zero angle $\alpha$.

The angle $\alpha$ is in this instance equal to 6°.

The support 21 also comprises a first duct 44*a* positioned between the two first fastening posts 41*a*, and a second duct 44*b* positioned between the two second fastening posts 41*b*. The axes Y of the ducts 44 are parallel to the longitudinal axes X of the fastening posts 41.

The support 21 also comprises a first fastening bracket 45*a* and a second fastening bracket 45*b* that make it possible to fasten the electrical module 20 to the housing part 3.

The first fastening bracket 45*a* and the second fastening bracket 45*b* extend in a horizontal plane.

The first fastening bracket 45*a* is positioned in the vicinity of the first lateral edge 43*a* of the support, and the second fastening bracket 45*b* is positioned in the vicinity of the second lateral edge 43*b* of the support. The first fastening bracket 45*a* and the second fastening bracket 45*b* extend laterally and towards the outside of the support 21 respectively from the first fastening post 41*a* (lower post) and the second fastening post 41*b* (lower post).

The support 21 is, in this instance, manufactured from a material that is transparent or translucent to infrared light. For example, it is a polycarbonate or MABS (methylmethacrylate acrylonitrile butadiene styrene) plastic material.

The printed circuit board 22 comprises a printed circuit 50 and components mounted on the printed circuit.

These components comprise a camera 51, an IR (infrared) receiver 52, two LEDs (light-emitting diodes) 53, a first microphone 54*a* and a second microphone 54*b*.

The camera 51, the IR receiver 52 and the LED 53 are mounted on the outer face of the printed circuit 50 (the face positioned towards the outside when the set-top box 1 is assembled).

The two microphones 54 are mounted on the inner face of the printed circuit 50. The printed circuit 50 comprises two holes 55, each of which allows acoustic communication to be established between the sensitive cell of one of the microphones and the outside.

The electrical module 20 also comprises a shutter 56 and light guides 57. The shutter 56 comprises a grip portion 58 and a functional portion 59. The grip portion 58 is a pin positioned in the hole 39 and which protrudes through the outer wall 24 of the plate 23, thus allowing it to be operated by a user. The functional portion 59 comprises a solid surface 60 and a hole 61 that has the dimensions of the hole 36.

The electrical module 20 also comprises at least one dust protection component, in this case a circular protective window 62 and an annular seal 63 made in this case from foam.

The process of assembling the set-top box 1 will now be described.

The electrical module 20 is assembled first, independently of the assembly of the rest of the set-top box 1.

It may therefore be an independent component with its own part number (P/N) and serial number (S/N).

The protective window 62 is first positioned on the surface 38 of the shoulder 37 around the hole 36. The protective window 62 is adhered to said surface 38.

The shutter 56 is installed. The grip portion 58 of the shutter is inserted through the hole 39. By sliding this grip portion 58 in the hole 39, the user can selectively position the solid surface 60 or the hole 61 in front of the lens of the camera 51. The user can therefore enable the camera 51 to produce images of the environment in front of the set-top box 1 or conversely ensure that the camera 51 cannot produce images.

It should be noted that, optionally, the grip portion 58 of this shutter 56 is backlit to indicate the status of the camera 51 (on/off).

The seal 63 is then positioned around the lens of the camera 51.

For each microphone 54, a seal 65, in this instance made from foam, is positioned on the outer face of the printed circuit 50 surrounding the hole.

The light guide 57 is positioned in front of the LEDS 53.

The printed circuit board 22 is then positioned between the first fastening bracket 45*a* and the second fastening bracket 45*b*. The outer face of the printed circuit 50 of the printed circuit board 22 is situated in front of the inner wall 25 of the plate 23 of the support 21.

The printed circuit board 22 is applied against the outer faces of the first fastening posts 41*a* and the second fastening posts 41*b*, each of said outer faces being perpendicular to the longitudinal axis X of the corresponding fastening post 41.

The centre of the lens of the camera 51 is then positioned facing the centre of the hole 36.

The centres of the holes 55 of the microphones 54 are similarly positioned facing the centres of the ducts 44. The first microphone 54*a* and the second microphone 54*b* are therefore in acoustic communication with the outside respectively via the first duct 44*a* and the second duct 44*b* formed on the support, and via the holes 40 of the plate 23.

The printed circuit board 22 is then screwed onto to the support by screws 70 that are screwed into the fastening posts 41.

The seal 63, which is positioned between the printed circuit board 22 and the support 21, is therefore compressed. The window 62, the seal 63 and the thickness of the support 21 (of the plate 23, in this instance) form an enclosure 71 in which the lens of the camera 51 is positioned. The lens is thus completely isolated from the outside environment by the window 62 and by the seal 63. The enclosure 71 therefore protects the lens from dust and any contamination.

The seals 65 are also compressed. For each microphone 54, as described above, the board 22 is screwed parallel to the axis of the associated duct 44 by means of two screws 70 arranged to either side of the seal 65. This ensures that the seals 65 are compressed. This allows attenuation of at least 30 dB to be achieved, and therefore very good voice recognition performance.

During the screwing operation, the printed circuit board 22 is therefore pressed against the outer face of the fastening posts 41. The axis of the camera 51, which is itself orthogonal to the plane of the printed circuit board 22, is then tilted upwards by the angle $\alpha$, which is in this instance equal to 6°.

The upward orientation of the axis of the camera 51 meets a functional specification. This orientation n is achieved by inclining the longitudinal axis of the fastening posts 41 upwards relative to the horizontal.

Once the electrical module 20 has been assembled, it is sent to the assembly line responsible for assembling the set-top box 1.

The electrical module 20 is then incorporated into the housing part 3. The lateral edges 43 of the support 21 have a shape that matches the lateral edges 11 of the notch 8, which makes it possible to implement a sliding connection. During the incorporation of the electrical module 20, the surface 30*a* slides over the surface 13*a*, the surface 30*b* slides over the surface 13*b*, and the reinforcements 14 slide in the angle-shaped portions 33.

The lateral edges 43*a*, 43*b* of the support 21 of the electrical module 20 and the lateral edges 11*a*, 11*b* of the notch 8 therefore have ribs of matching shapes, which act as a slideway and allow the electrical module 20 to be inserted vertically into the notch 8 of the housing part 3.

The fastening brackets 45*a*, 45*b* come to bear on the fastening posts 15*a*, 15*b* when the electrical module 20 is completely inserted. The electrical module 20 is then screwed onto the housing part 3 by vis 72 that are screwed into the fastening posts 15*a*, 15*b*. The heads of the screws 72 come to bear on the fastening brackets 45*a*, 45*b* of the support 21 at the end of the screwing operation.

The electrical module 20 thus extends between the inner wall 10 of the front face of the housing and the reinforcing rib 18.

The outer wall 24 of the plate 23 of the support 21 of the electrical module 20 extends into the notch 8 in order to form a portion of the outer wall of the lateral face of the housing 1. The outer wall 24 of the electrical plate 23 and the rest of the outer wall of the front face 5*a* of the housing 2 extend in the same plane, without any discontinuity in thickness.

The electrical module 20 and its incorporation into the rest of the set-top box 1 have a certain number of advantages.

The electrical module 20 can be assembled on a different production line to the rest of the set-top box 1. This is particularly advantageous. The manufacturer of the set-top box 1, or at least the entity responsible for the final assembly of the set-top box 1, no longer needs to have an ISO 8 assembly station. Indeed, the electrical module 20 can be assembled by another entity (for example, by the supplier of the camera or the printed circuit board) who then sends the fully assembled electrical module 20 to the manufacturer of the set-top box 1. Next, the manufacturer of the set-top box 1 incorporates the add-on electrical module 20 into the set-top box 1 without this incorporation needing an ISO 8 controlled environment.

As described above, the axis of the camera 51 is oriented upwards, relative to the horizontal, by an angle $\alpha$ (in this instance equal to) 6°. This orientation is made possible by the orientation of the fastening posts 41.

This 6° orientation of the fastening posts 41 in the support 21 relative to the horizontal requires the direction of demoulding of these functions from the mould to be tilted at the same angle. It would have been very complicated, if these functions had been incorporated directly into the housing 2 without adding the electrical module 20, to use tooling with a vertical natural demoulding direction. With this solution, the disparity in assembly angles is managed solely on the support 21 of the electrical module 20 by demoulding the fastening brackets 45 tilted at 6° relative to the other functions, which is much simpler to achieve on the tooling of the support 21.

It should also be noted, with respect to the electrical module 20, that screwing a board carrying the microphones onto a lateral face of the housing, in a direction orthogonal to the board, would be an extremely complicated operation to perform in the "complete" housing because it would entail accessibility problems for the screwdriver. By contrast, the electrical module 20 allows the microphone function to be assembled in the set-top box 1 by vertical screwing in the most straightforward assembly direction, while ensuring sealing at the microphones.

It should also be noted that relocating the front face functions to the electrical module 20 helps optimise the compactness of the set-top box 1, because if all of the mechanical functions had been kept in the housing 2, shims would have been required in the tooling in order to permit demoulding to be carried out. It would not have been possible to maintain such close proximity between the printed circuit board 22 of the electrical module 20 and the loudspeaker, the antenna of the front face 5*a* or the motherboard.

In particular, as the front face of the set-top box 1 is very cluttered, it would have been impossible to include a window transparent or translucent to infrared light there with dimensions sufficient in order not to mask the cone of vision of the IR receiver positioned on the board 22 without interfering with the other functions.

To solve this problem, it might have been possible to manufacture the entire housing part 3 with a material that allows infrared rays to pass through, but this would have raised problems of cost, cosmetics (such a material is more sensitive to cosmetic defects) and ecological design (non-recycled material).

By contrast, in the invention, only the support 21 is injected in a material that is transparent or translucent to infrared, which limits the use of this material in the product while avoiding masking portions of the reception cone of the IR receiver and thus guaranteeing optimum angular range.

Naturally, the invention is not limited to the embodiment described, but comprises any variant entering into the field of the invention, such as defined by the claims.

The invention may be implemented with components different to those cited here. For example, the seals are not necessarily made of foam, the means for fastening the board to the support and the support to the housing may be different (clip fastening may be considered, for example), the printed circuit board does not necessarily comprise microphones, LEDs or an IR receiver, etc.

The matching shapes of the lateral edges of the support and the notch may be different.

The notch could be formed in the upper edge of a housing part.

The invention claimed is:

1. An electrical module intended to be incorporated into an item of electrical equipment, and comprising:

a support that comprises an inner wall, a hole passing through the thickness of the support, and lateral edges arranged to implement a sliding connection for inserting the support vertically into a notch formed in a lower or upper edge of a lateral face of a housing part of the electrical equipment, the support comprising a plate that is trapezoidal in shape, the plate comprising the inner wall and two angle-shaped portions, which extend from the inner wall, each portion extending longitudinally in the vicinity of a lateral edge of the plate and enabling the implementation of the sliding connection;

at least one dust protection component; and a printed circuit board comprising a camera;

the electrical module being such that, when it is assembled, the printed circuit board is fastened to the inner wall of the support in such a way that the camera is positioned facing the hole, and the at least one dust protection component forms, with a thickness of the support, an enclosure in which a lens of the camera is positioned and which protects it from dust.

2. The electrical module according to claim 1, in which the at least one dust protection component comprises a seal positioned around the camera lens between the printed circuit board and the support, and a protective window fastened to an outer wall of the support.

3. The electrical module according to claim 1, in which the support comprises at least one first fastening post situated next to a first lateral edge of the support, and at least one second fastening post situated next to a second lateral edge of the support, the first fastening post and the second fastening post allowing the printed circuit board to be fastened to the inner wall of the support, a longitudinal axis of each fastening post being tilted upwards, relative to a horizontal plane, by a non-zero angle.

4. The electrical module according to claim 3, the support further comprising a first fastening bracket and a second fastening bracket that extend in the horizontal plane and that make it possible to fasten the electrical module to the housing part, the first fastening bracket and the second fastening bracket extending laterally and towards the outside of the support respectively from the first fastening post and the second fastening post, such that, when the electrical module is assembled, the printed circuit board is positioned between the first fastening bracket and the second fastening bracket.

5. The electrical module according to claim 3, in which the support comprises two first fastening posts and two second fastening posts, and in which a first microphone and a second microphone are mounted on the printed circuit board, the first microphone and the second microphone being in acoustic communication with the outside respectively via a first duct and a second duct formed on the support, the first duct extending between the two first fastening posts and the second duct between the two second fastening posts.

6. The electrical module according to claim 1, in which an infrared receiver is mounted on the printed circuit board, the support being manufactured from a material that is transparent or translucent to infrared light.

7. An item of electrical equipment comprising an electrical module and a housing, the electrical module comprising:

a support that comprises an inner wall, a hole passing through the thickness of the support, and lateral edges arranged to implement a sliding connection for inserting the support vertically into a notch formed in a lower or upper edge of a lateral face of a housing part of the electrical equipment;

at least one dust protection component; and a printed circuit board comprising a camera, the electrical module being such that, when it is assembled, the printed circuit board is fastened to the inner wall of the support in such a way that the camera is positioned facing the hole, and the at least one dust protection component forms, with a thickness of the support, an enclosure in which a lens of the camera is positioned and which protects it from dust, the housing comprising a housing part having a lateral face comprising a lower or upper edge in which a notch is formed, lateral edges of the notch being arranged to cooperate with the lateral edges of the support in order to implement the sliding connection, and an outer wall of the support of the electrical module extending into the notch in order to form a portion of an outer wall of the lateral face of the housing part.

8. The item of electrical equipment according to claim 7, in which the housing part comprises a reinforcing rib that extends vertically from a bottom of the housing part, linking the lateral edges of the notch to each other.

9. The item of electrical equipment according to claim 7, the electrical equipment being a set-top box.

* * * * *